(12) United States Patent
Meng et al.

(10) Patent No.: US 12,230,665 B2
(45) Date of Patent: Feb. 18, 2025

(54) ARRAY SUBSTRATE AND PREPARATION METHOD THEREFOR, AND DISPLAY PANEL AND DISPLAY DEVICE

(71) Applicant: BOE TECHNOLOGY GROUP CO., LTD., Beijing (CN)

(72) Inventors: Ke Meng, Beijing (CN); Qiangwei Cui, Beijing (CN); Chao Liu, Beijing (CN); Lili Wang, Beijing (CN); Chuhang Wang, Beijing (CN); Yutian Chu, Beijing (CN); Linhui Gong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 929 days.

(21) Appl. No.: 17/264,036

(22) PCT Filed: Jun. 15, 2020

(86) PCT No.: PCT/CN2020/096106
§ 371 (c)(1),
(2) Date: Jan. 28, 2021

(87) PCT Pub. No.: WO2020/259337
PCT Pub. Date: Dec. 30, 2020

(65) Prior Publication Data
US 2021/0296394 A1   Sep. 23, 2021

(30) Foreign Application Priority Data

Jun. 25, 2019 (CN) .......................... 201910554975.1

(51) Int. Cl.
*H01L 27/15* (2006.01)
*H01L 33/00* (2010.01)
*H01L 33/62* (2010.01)

(52) U.S. Cl.
CPC .......... *H01L 27/156* (2013.01); *H01L 33/005* (2013.01); *H01L 33/62* (2013.01); *H01L 2933/0066* (2013.01)

(58) Field of Classification Search
CPC ... H01L 25/167; H01L 27/156; H01L 33/005; H01L 33/62; H01L 2933/0066; H01L 33/0066; H10K 77/111; H10K 2102/311
See application file for complete search history.

(56) References Cited

U.S. PATENT DOCUMENTS 9,564,483 B2 * 2/2017 Seo ...................... H10K 59/131
9,651,996 B2 * 5/2017 Zhou ................... B32B 38/0012
(Continued)

FOREIGN PATENT DOCUMENTS

CN       106898264 A       6/2017
CN       108051965 A       5/2018
(Continued)

*Primary Examiner* — Ratisha Mehta
(74) *Attorney, Agent, or Firm* — Chiwin Law LLC

(57) ABSTRACT

An array substrate and a manufacturing method thereof, a display panel, and a display device are provided. The array substrate includes a bonding region and a non-bonding region, and further includes: a rigid substrate, in the non-bonding region; a driving circuit layer, in the non-bonding region; a light-emitting diode layer, on a side of the driving circuit layer away from the rigid substrate; a flexible base layer, in the bonding region and on the same side of the rigid substrate as the driving circuit layer; and a bonding wire layer, on a side of the flexible base layer away from the rigid substrate. The bonding wire layer and the flexible base layer is capable of being bent along an edge of the rigid substrate to a side of the rigid substrate away from the driving circuit layer.

18 Claims, 12 Drawing Sheets

(56) References Cited

U.S. PATENT DOCUMENTS

| | | |
|---|---|---|
| 10,080,281 B2 * | 9/2018 | Jung ................. H05K 1/147 |
| 10,290,239 B2 | 5/2019 | Liu |
| 2016/0212839 A1 | 7/2016 | Choi et al. |
| 2018/0113564 A1 * | 4/2018 | Takahashi ............ G06F 3/0446 |
| 2019/0165060 A1 * | 5/2019 | Choi ................. H10K 59/873 |
| 2019/0181317 A1 * | 6/2019 | Yu ................... H01L 25/0753 |
| 2019/0189722 A1 * | 6/2019 | Lim ................... H10K 77/111 |
| 2019/0204657 A1 | 7/2019 | Hu et al. |
| 2020/0136065 A1 | 4/2020 | Li |
| 2021/0183840 A1 | 6/2021 | Wang |

FOREIGN PATENT DOCUMENTS

| | | |
|---|---|---|
| CN | 109148530 A | 1/2019 |
| CN | 109461382 A | 3/2019 |
| CN | 110164901 A | 8/2019 |

* cited by examiner providing a first substrate, wherein the first substrate comprise a flexible base layer, a bonding wire layer and a pixel electrode layer, the flexible base layer comprises a bonding region and a non-bonding region, the pixel electrode layer and the bonding wire layer are provided on the same side of the flexible base layer, the bonding wire layer is in the bonding region, the pixel electrode layer is in the non-bonding region, and the non-bonding region of the flexible base layer is provided with a second conductive via hole electrically connected to the bonding wire layer ⸺S210 providing a second substrate, wherein the second substrate comprises a rigid substrate and a driving circuit layer arranged in a stack, so as to enable an orthographic projection of the second substrate on the first substrate to coincide with the non-bonding region in a case where the second substrate and the first substrate are bonded with each other ⸺S220 bonding the first substrate and the second substrate to each other, so as to enable a side of the driving circuit layer away from the rigid substrate to be connected to a side of the non-bonding region of the flexible base layer away from the pixel electrode layer ⸺S230 providing a light-emitting diode on a side of the pixel electrode layer away from the rigid substrate, so as to enable the pixel electrode layer to form a light-emitting diode layer ⸺S240

FIG. 24

ARRAY SUBSTRATE AND PREPARATION METHOD THEREFOR, AND DISPLAY PANEL AND DISPLAY DEVICE

This application is a U.S. National Phase Entry of International Application No. PCT/CN2020/096106 filed on Jun. 15, 2020, designating the United States of America and claiming priority to Chinese Patent Application No. 201910554975.1, filed on Jun. 25, 2019. The present application claims priority to and the benefit of the above-identified applications and the above-identified applications are incorporated by reference herein in their entirety.

TECHNICAL FIELD

Embodiments of the present disclosure relate to an array substrate and a manufacturing method thereof, a display panel, and a display device.

BACKGROUND

Micro LEDs (micro light-emitting diodes) have been more and more widely used in the field of large-size integration due to excellent characteristics, such as self-illumination, high luminous efficiency, high contrast, wide operating temperature range, long service life, low power consumption, excellent resistance to water and oxygen, fast response, etc.

SUMMARY

At least one embodiment of the disclosure provides an array substrate, comprising a bonding region and a non-bonding region, wherein the array substrate further comprises: a rigid substrate, in the non-bonding region; a driving circuit layer, on a side of the rigid substrate and in the non-bonding region; a light-emitting diode layer, on a side of the driving circuit layer away from the rigid substrate and being electrically connected to the driving circuit layer; a flexible base layer, in the bonding region and on the same side of the rigid substrate as the driving circuit layer; and a bonding wire layer, on a side of the flexible base layer away from the rigid substrate and being electrically connected to the driving circuit layer, wherein the bonding wire layer and the flexible base layer is capable of being bent along an edge of the rigid substrate to a side of the rigid substrate away from the driving circuit layer.

In at least one example of the array substrate, for example, the flexible base layer extends to the non-bonding region and is between the rigid substrate and the driving circuit layer.

In at least one example of the array substrate, for example, the array substrate further comprises: a planarization layer, between the driving circuit layer and the light-emitting diode layer, wherein the planarization layer extends to a side of the bonding wire layer away from the rigid substrate.

In at least one example of the array substrate, for example, the flexible base layer extends to the non-bonding region and is between the driving circuit layer and the light-emitting diode layer.

In at least one example of the array substrate, for example, the flexible base layer is provided with a conductive via hole electrically connected to the bonding wire layer; and the array substrate further comprises: a conductive adhesive layer, between the driving circuit layer and the flexible base layer, wherein the bonding wire layer is electrically connected to the driving circuit layer through the conductive via hole and the conductive adhesive layer.

In at least one example of the array substrate, for example, the flexible base layer further comprises: a connection electrode, on a side of the flexible base layer away from the light-emitting diode layer and being electrically connected to the bonding wire layer through the conductive via hole.

In at least one example of the array substrate, for example, the array substrate further comprises: a buffer layer, between the rigid substrate and the driving circuit layer.

In at least one example of the array substrate, for example, the buffer layer is a flexible layer.

In at least one example of the array substrate, for example, the light-emitting diode layer comprises a pixel electrode layer and one or more light-emitting diodes on the pixel electrode layer.

In at least one example of the array substrate, for example, the light-emitting diodes comprise micro light-emitting diodes arranged in an array.

In at least one example of the array substrate, for example, the bonding wire layer comprises a plurality of bonding wires and a plurality of bonding pads, the plurality of bonding wires are electrically connected to the driving circuit layer, and the plurality of bonding pads are electrically connected to ends of the plurality of bonding wires away from the driving circuit layer in one-to-one correspondence.

In at least one example of the array substrate, for example, the array substrate further comprises: a bonding circuit component, wherein the bonding circuit component is in the bonding region and is electrically connected to the plurality of bonding pads.

At least one embodiment of the disclosure provides a manufacturing method of an array substrate, comprising: providing a rigid substrate material layer, wherein the rigid substrate material layer comprises a bonding region and a non-bonding region; forming a driving circuit layer, wherein the driving circuit layer is provided on a side of the rigid substrate material layer and is in the non-bonding region; forming a pixel electrode layer, wherein the pixel electrode layer is provided on a side of the driving circuit layer away from the rigid substrate material layer; forming a flexible base layer in the bonding region, wherein the flexible base layer and the driving circuit layer are provided on the same side of the rigid substrate material layer; forming a bonding wire layer, wherein the bonding wire layer is provided on a side of the flexible base layer away from the rigid substrate material layer and is electrically connected to the driving circuit layer; removing a portion of the rigid substrate material layer in the bonding region, so that a remaining portion of the rigid substrate material layer is formed into a rigid substrate, and the bonding wire layer and the flexible base layer is capable of being bent along an edge of the rigid substrate to a side of the rigid substrate away from the driving circuit layer; and providing a light-emitting diode on a side of the pixel electrode layer away from the rigid substrate, so that the pixel electrode layer and the light-emitting diode are form into a light-emitting diode layer.

In at least one example of the manufacturing method, for example, the flexible base layer is in the non-bonding region and the bonding region, and is between the rigid substrate material layer and the driving circuit layer, and removing the portion of the rigid substrate material layer in the bonding region comprises: separating the portion of the rigid substrate material layer in the bonding region from the flexible base layer by a lifting method, and removing the portion of the rigid substrate material layer in the bonding region by a cutting method.

In at least one example of the manufacturing method, for example, the flexible base layer is in the non-bonding region and the bonding region, the flexible base layer extends to the non-bonding region and is between the driving circuit layer and the light-emitting diode layer, and the manufacturing method further comprises: forming a buffer layer on the rigid substrate material layer, wherein the driving circuit layer is formed on a side of the buffer layer away from the rigid substrate material layer, and removing a portion of the buffer layer in the bonding region subsequent to removing the portion of the rigid substrate material layer in the bonding region.

In at least one example of the manufacturing method, for example, forming the flexible base layer in the bonding region comprises: forming a conductive via hole electrically connected to the bonding wire layer in the flexible base layer.

In at least one example of the manufacturing method, for example, forming the flexible base layer in the bonding region further comprises: forming a connection electrode on a side of the flexible base layer away from the pixel electrode layer, wherein the connection electrode is electrically connected to the bonding wire layer through the conductive via hole.

At least another embodiment of the disclosure provides a manufacturing method of an array substrate, comprising: providing a first substrate, wherein the first substrate comprise a flexible base layer, a bonding wire layer and a pixel electrode layer, the flexible base layer comprises a bonding region and a non-bonding region, the pixel electrode layer and the bonding wire layer are provided on the same side of the flexible base layer, the bonding wire layer is in the bonding region, the pixel electrode layer is in the non-bonding region, and the non-bonding region of the flexible base layer is provided with a conductive via hole electrically connected to the bonding wire layer; providing a second substrate, wherein the second substrate comprises a rigid substrate and a driving circuit layer arranged in a stack, so as to enable an orthographic projection of the second substrate on the first substrate to coincide with the non-bonding region in a case where the second substrate and the first substrate are bonded with each other; bonding the first substrate and the second substrate to each other, so as to enable a surface of the driving circuit layer away from the rigid substrate to be connected to a surface of the non-bonding region of the flexible base layer away from the pixel electrode layer; and providing a light-emitting diode on a surface of the pixel electrode layer away from the rigid substrate, so as to enable the pixel electrode layer and the light-emitting diode to form a light-emitting diode layer.

At least another embodiment of the disclosure provides a display panel, comprising the array substrate according to any embodiments as mentioned above.

At least another embodiment of the disclosure provides a display device, comprising the display panel according to any embodiments as mentioned above.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

FIG. 24 is a schematic flowchart of a manufacturing method of an array substrate according to an embodiment of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A glass substrate provided with a driving circuit can be used to drive a micro LED to emit light, so as to realize high resolution of a micro LED screen. However, a glass through hole is difficult to be provided on the glass substrate after the glass substrate is provided with the driving circuit, so that the glass substrate cannot be bent to reduce the frame size, which leads to a large gap in the large-size display screen spliced by micro LED screens and further reduces the display effect.

Figure 1:
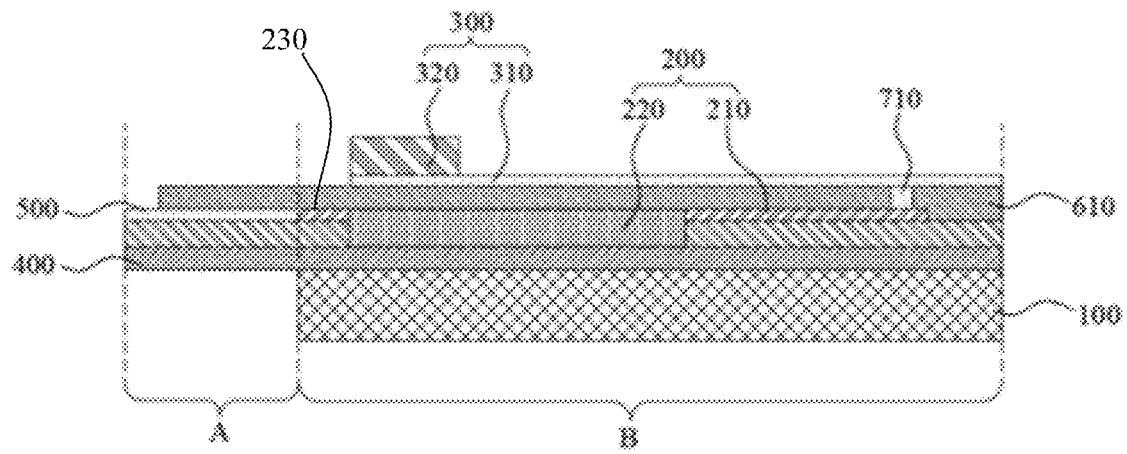
FIG. 1 is a schematic structural diagram of an array substrate according to an embodiment of the present disclosure.
Figure 8:
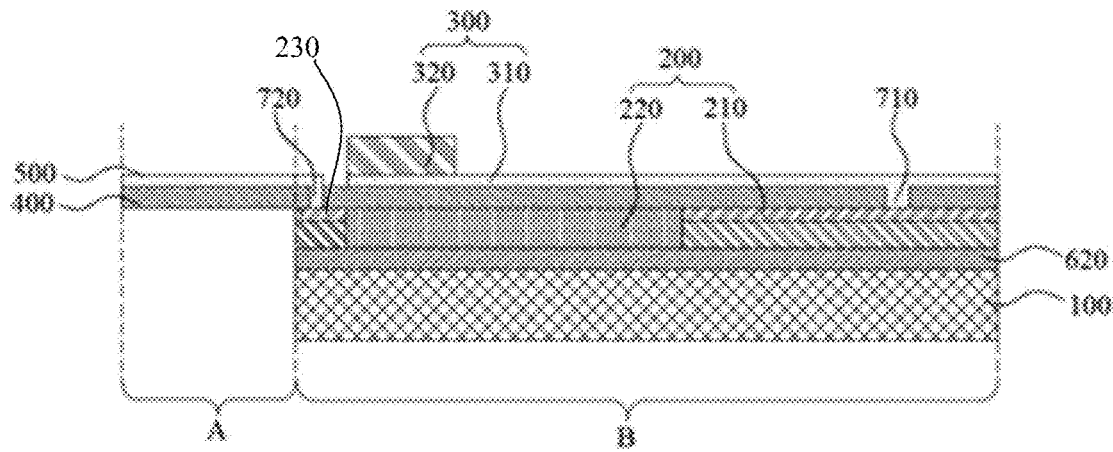
FIG. 8 is a schematic structural diagram of an array substrate according to an embodiment of the present disclosure.
Figure 16:
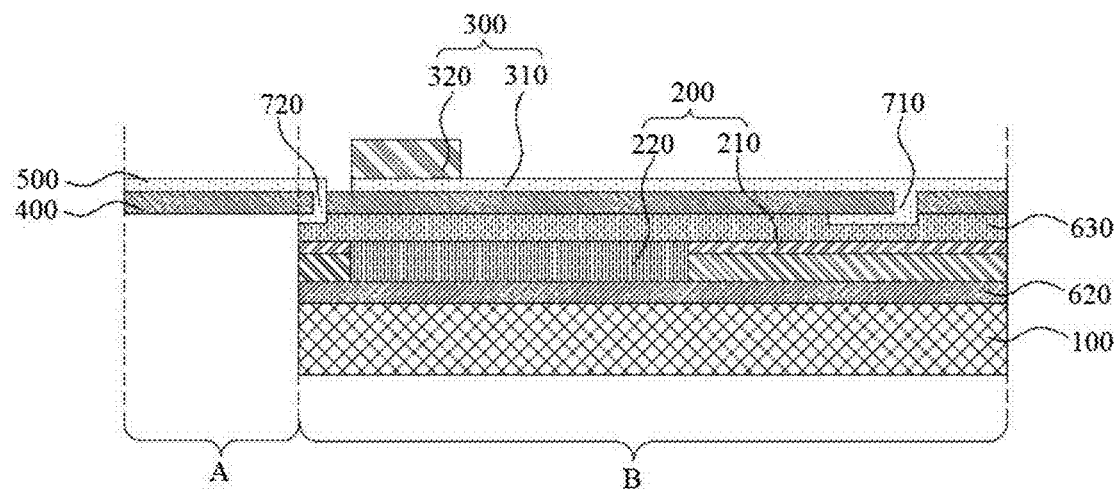
FIG. 16 is a schematic structural diagram of an array substrate according to an embodiment of the present disclosure.

At least one embodiment of the present disclosure provides an array substrate, and the array substrate is used to prepare a display panel. As illustrated in FIG. 1, FIG. 8, and FIG. 16, the array substrate includes a bonding region A and a non-bonding region B, and further includes a rigid substrate 100, a driving circuit layer 200, a light-emitting diode layer 300, a flexible base layer 400, and a bonding wire layer 500.

The rigid substrate 100 is provided in the non-bonding region B. The driving circuit layer 200 is provided on a side of the rigid substrate 100, and for example, includes a plurality of driving circuits. The light-emitting diode layer 300 is provided on a side of the driving circuit layer 200 away from the rigid substrate 100. The flexible base layer 400 is provided in the bonding region A and is located on the same side of the rigid substrate 100 as the driving circuit layer 200. The bonding wire layer 500 is provided on a side of the flexible base layer 400 away from the rigid substrate 100, and the bonding wire layer 500 is electrically connected to at least one driving circuit in the driving circuit layer 200.

Figure 2:
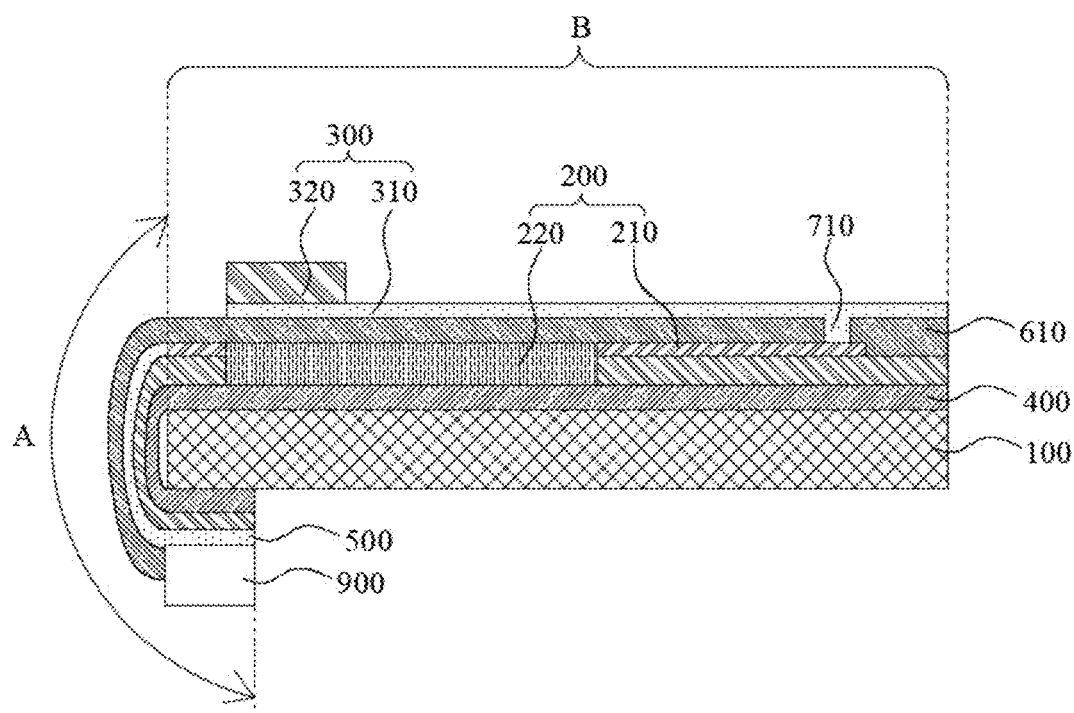
FIG. 2 is a schematic structural diagram of a display panel according to an embodiment of the present disclosure.
Figure 9:
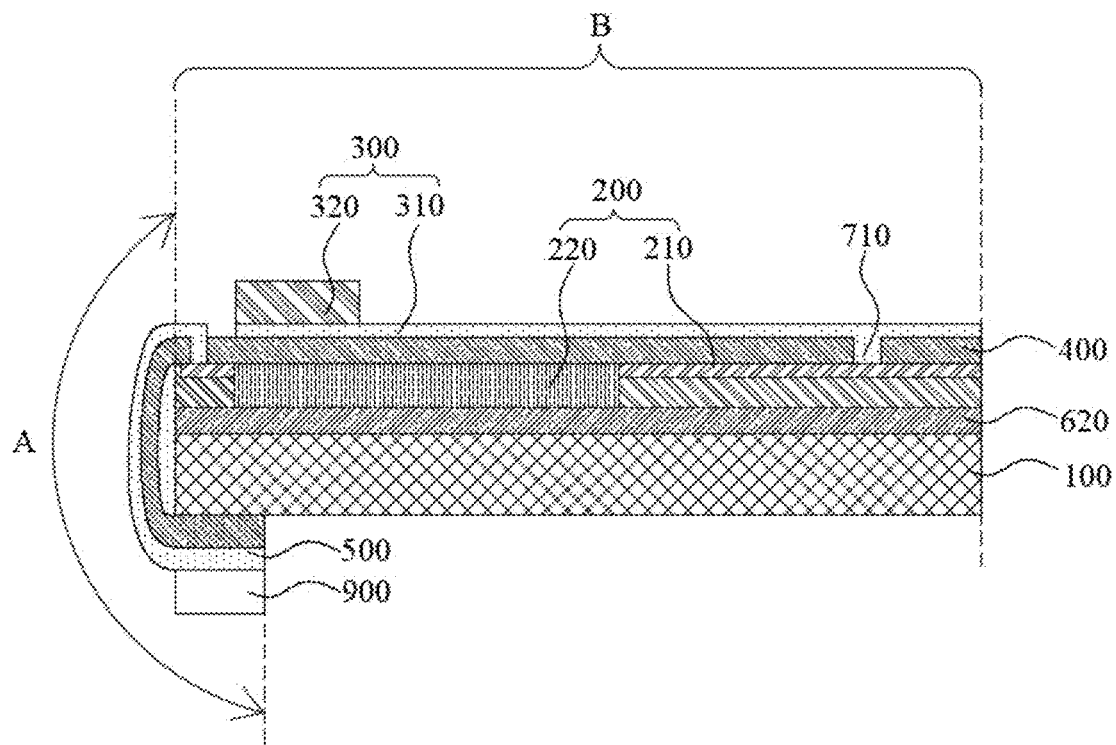
FIG. 9 is a schematic structural diagram of a display panel according to an embodiment of the present disclosure.
Figure 17:
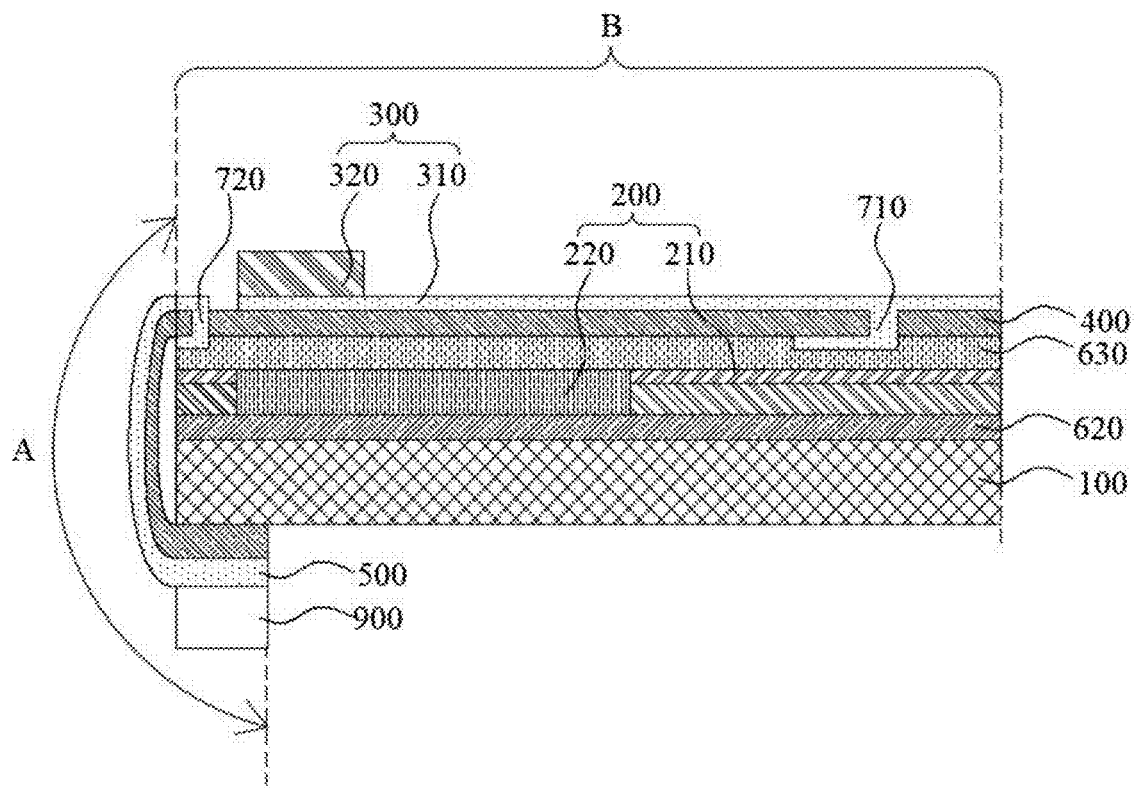
FIG. 17 is a schematic structural diagram of a display panel according to an embodiment of the present disclosure.

As illustrated in FIG. 2, FIG. 9, and FIG. 17, the bonding wire layer 500 and the flexible base layer 400 can be bent along an edge of the rigid substrate 100 to a side of the rigid substrate 100 away from the driving circuit layer 200, and for example, at this side, at least partially extends in a plane parallel to the main surface of the rigid substrate 100, so as to overlap with the non-bonding region B in a direction perpendicular to the main surface of the rigid substrate 100. This side is the non-display side of the display panel.

In the array substrate according to the embodiment of the present disclosure, the rigid substrate 100 is not provided in the bonding region A, and therefore, the bonding wire layer 500 can be bent to the side of the rigid substrate 100 away from the driving circuit layer 200 (the back side of the array substrate) and is connected to the circuit board 900 (that is, the circuit board 900 is bonded in the bonding region A), which avoids the circuit board 900 from being connected to the side of the rigid substrate 100 close to the driving circuit layer 200 (the light-emitting side of the array substrate), thereby effectively reducing the frame size of the display panel including the array substrate and further reducing the gap of the display device spliced by display panels, so that the display effect is improved.

Hereinafter, components of the array substrate provided by multiple embodiments of the present disclosure are described in detail with reference to the accompanying drawings.

The rigid substrate 100 is disposed in the non-bonding region B and used to support structures such as the driving circuit layer 200. In an embodiment, the material of the rigid substrate 100 may be glass, acrylic, or other materials, which is not limited in the present disclosure.

As illustrated in FIG. 1, FIG. 8, and FIG. 16, the driving circuit layer 200 is provided on one side of the rigid substrate 100. The driving circuit layer 200 is provided with the driving circuit for driving the light-emitting diode 320 to emit light. For example, the driving circuit includes at least one electronic component 220. The electronic component 220 includes but is not limited to transistors, capacitors, resistors, coils, etc. It can be understood that the driving circuit layer 200 is further provided with a transfer electrode 210 and a signal wire 230 for connecting the electronic component 220. In one embodiment, thin film transistors are provided in the driving circuit.

In at least one embodiment, the non-bonding region B includes a pixel array, for example, the non-bonding region B includes a display region, and the display region includes the pixel array. The pixel array includes a plurality of pixel units arranged in a plurality of rows and a plurality of columns, and each pixel unit includes a pixel circuit and a light-emitting element. The non-bonding region B may further include a plurality of gate lines, a plurality of data lines, and other signal wires, which are respectively connected to corresponding pixel units in the pixel array to provide scanning signals, data signals, and the like for the plurality of pixel units in the pixel array. The pixel circuit is configured to drive the light-emitting element in the corresponding pixel unit to emit light according to such as the received scanning signal and data signal. According to needs, the pixel circuit may include a plurality of switching components (such as thin film transistors) and capacitors, which are located in the driving circuit layer 200, that is, the driving circuit layer 200 includes pixel circuits of the plurality of pixel units. In addition, the driving circuit layer 200 further includes the aforementioned various signal wires.

For example, the pixel circuit may be a 2T1C pixel circuit, which includes two TFTs (thin film transistors) and a storage capacitor Cs to drive the light-emitting element to emit light. One of the two TFTs is a driving transistor, and the other of the two TFTs is a data writing transistor. For another example, based on the above 2T1C pixel circuit, the pixel circuit may also have a compensation function. The compensation function may be realized by voltage compensation, current compensation, or combined compensation, the pixel circuit with the compensation function may be a 4T1C pixel circuit, a 4T2C pixel circuit, or the like, and details are not described herein.

The driving circuit layer includes a multi-layer laminated structure, for example, including one or more conductive layers, one or more insulating layers, and one or more semiconductor layers. The conductive layer may be electrically connected to the adjacent conductive layer or semiconductor layer through via holes provided in the intermediate insulating layer. The one or more conductive layers are used to form the gate electrode, source electrode and drain electrode of the thin film transistor, the electrode of the storage capacitor, various signal wires, etc. For example, the gate line and the gate electrode of the thin film transistor may be provided on the same layer, and the data line and the source electrode and drain electrode of the thin film transistor may be provided on the same layer. The transfer electrode is electrically connected to the corresponding pixel circuit, so as to realize the electrical connection between the pixel circuit and the light-emitting diode, for example. The one or more insulating layers may be inorganic insulating layers or organic insulating layers, and may be located only in the non-bonding region or located in both the bonding region and the non-bonding region. For example, the light-emitting element may be a light-emitting diode.

As illustrated in FIG. 1, FIG. 8, and FIG. 16, the light-emitting diode layer 300 is provided on the side of the driving circuit layer 200 away from the rigid substrate 100, and may include the pixel electrode layer 310 electrically connected to the driving circuit layer 200 (the pixel circuit of the corresponding pixel unit) and the light-emitting diode 320 connected to the pixel electrode layer 310. It can be understood that the pixel electrode layer 310 may be provided with the pixel electrode and the pixel electrode is electrically connected to the driving circuit. For example, each pixel unit includes a corresponding pixel electrode, and the pixel electrode is electrically connected to the pixel circuit of the pixel unit and electrically connected to the light-emitting diode of the pixel unit, so that the pixel circuit can drive the light-emitting diode. For example, the array substrate further includes a pixel definition layer, the pixel definition layer includes pixel openings corresponding to the plurality of pixel units and for example, at least partially covers the plurality of pixel electrodes, and the plurality of pixel openings at least partially expose the plurality of pixel electrodes, respectively, so that the plurality of light-emitting diodes are electrically connected to the plurality of pixel electrodes through the plurality of pixel openings, respectively.

For example, the light-emitting diode 320 may be a micro light-emitting diode (micro LED), a nano light-emitting diode (nano LED), or other types of light-emitting diodes, such as an organic light-emitting diode (OLED) or a quantum dot light-emitting diode (QLED), and the present disclosure is not limited in this aspect. In one embodiment, the light-emitting diode layer 300 includes micro light-emitting diodes 320 arranged in an array, and the micro light-emitting diodes 320 correspond to the plurality of pixel units in the pixel array.

Figure 15:
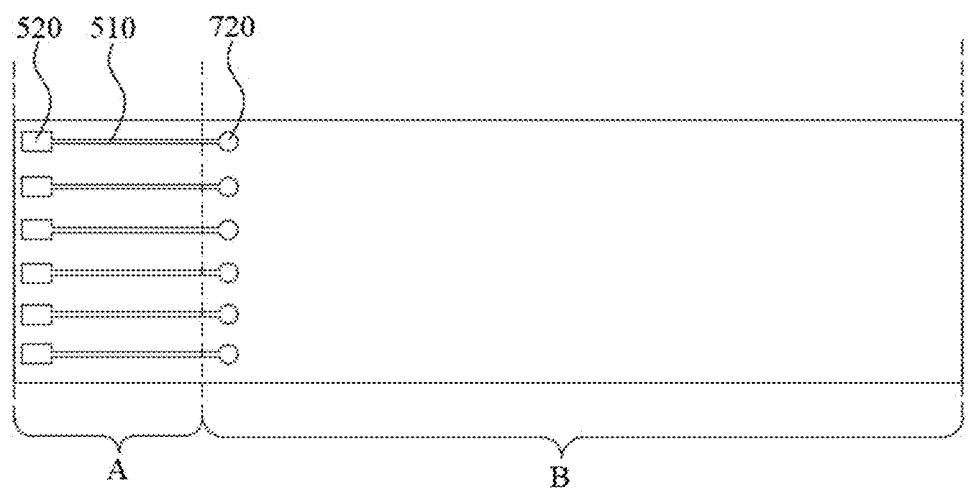
FIG. 15 is a schematic top view of a structure of a bonding wire layer according to an embodiment of the present disclosure.

As illustrated in FIG. 15, the bonding wire layer 500 may include a plurality of bonding wires 510 (bonding lines) and a plurality of bonding pads 520. The plurality of bonding wires 510 are connected to the plurality of signal wires 230 in the driving circuit layer 200 in one-to-one correspondence, and the plurality of bonding pads 520 are connected to ends of the plurality of bonding wires 510 away from the driving circuit in one-to-one correspondence.

In one aspect, in order to connect each bonding wire 510 to the corresponding bonding pad 520, the bonding wire layer 500 needs to have a certain width. If the bonding wire layer 500 cannot be bent to the back side of the rigid substrate 100 (the side of the rigid substrate 100 away from the driving circuit layer 200), the bonding wire layer 500 may completely appear on the light-emitting side of the display panel using the array substrate, which may cause the display panel to have a larger frame.

In the array substrate according to the embodiment of the present disclosure, the bonding wire layer 500 can be bent towards the back side of the rigid substrate 100, which reduces the area of the bonding wire layer 500 exposed to the light-emitting side of the display panel, thereby reducing the frame size of the display panel.

In another aspect, the bonding pad 520 is used to be electrically connected to a bonding circuit component, and for example, the bonding circuit component is bonded in the bonding region by a conductive adhesive. For example, the bonding circuit component is the circuit board 900. If the bonding wire layer 500 cannot be bent towards the back side of the rigid substrate 100, the circuit board 900 needs to be connected to the light-emitting side of the display panel, which increases the frame size of the display panel. Even if the circuit board 900 is a flexible circuit board 900, the flexible circuit board 900 still increases the frame size of the display panel. In the array substrate according to the embodiment of the present disclosure, the bonding wire layer 500 can be bent towards the back side of the rigid substrate 100, so that the array substrate is bonded to the circuit board 900 on the back side, which avoids that the circuit board 900 needs to be arranged on the side surface of the rigid substrate 100 to increase the frame size of the display panel. In the embodiment of the present disclosure, the bonding circuit component may also be an integrated circuit chip (for example, a driver chip) or the like, which is not limited in the present disclosure.

The flexible base layer 400 may be made of a flexible material such as resin, and for example, a polyimide (PI) material may be used. The flexible base layer 400 is used to support and fix the bonding wire layer 500 to prevent the bonding wire layer 500 from being damaged when being bent.

In one embodiment, as illustrated in FIG. 1, the flexible base layer 400 may extend to the non-bonding region B and is located between the rigid substrate 100 and the driving circuit layer 200. In this way, the flexible base layer 400 can serve as a buffer layer between the driving circuit layer 200 and the rigid substrate 100.

In this way, the driving circuit layer 200 and the bonding wire layer 500 are disposed on the same side of the flexible base layer 400, and the driving circuit layer 200 and the bonding wire layer 500 are electrically connected. Optionally, the bonding wire 510 and the signal wire 230 which are connected to each other are different parts of the same wire.

Optionally, a plurality of signal wires may be arranged on the side of the flexible base layer 400 away from the rigid substrate 100, the part of the signal wire located in the bonding region A is the bonding wire 510, and the part of the signal wire located in the non-bonding region B is the signal wire 230.

Optionally, as illustrated in FIG. 1, the array substrate may further include a planarization layer 610, the planarization layer 610 is provided between the driving circuit layer 200 and the light-emitting diode layer 300, and the planarization layer 610 extends to the side of the bonding wire layer 500 away from the rigid substrate 100. The bonding wire layer 500 and the driving circuit layer 200 are provided on the same side of the planarization layer 610.

Optionally, as illustrated in FIG. 1, a first conductive via hole 710 may be provided on the planarization layer 610, and the light-emitting diode layer 300 may be electrically connected to the driving circuit layer 200 through the first conductive via hole 710. For example, for each pixel unit, the light-emitting diode located in the light-emitting diode layer 300 may be electrically connected to the pixel circuit located in the driving circuit layer 200 through the first conductive via hole 710 and the transfer electrode 210.

Optionally, in the bonding region A, an insulating material layer may be further provided between the bonding wire layer 500 and the flexible base layer 400, and the material of the insulating material layer may include one or more of insulating materials used in the driving circuit layer 200. In this way, the insulating material deposited in the bonding region A does not need to be completely removed during the preparation of the driving circuit layer 200, thereby simplifying the preparation of the array substrate.

In another embodiment, as illustrated in FIG. 8, the flexible base layer 400 may extend to the non-bonding region B and is located between the driving circuit layer 200 and the light-emitting diode layer 300. In this way, the bonding wire layer 500 and the light-emitting diode layer 300 may be disposed on the same side of the flexible base layer 400. The flexible base layer 400 can also play a role in flattening the surface of the driving circuit layer 200 away from the rigid substrate 100, so as to facilitate further forming the light-emitting diode layer 300. Since the driving circuit layer 200 is disposed on the side of the flexible base layer 400 away from the bonding wire layer 500, there is no residual material of the driving circuit layer 200 between the flexible base layer 400 and the bonding wire layer 500, so that the flexible base layer 400 and the bonding wire layer 500 may have a smaller thickness and be easier to be bent, which may further reduce the frame size of the display panel and reduce the bending stress of the flexible base layer 400 and the bonding wire layer 500.

Optionally, the bonding wire 510 in the bonding wire layer 500 and the pixel electrode (located in the pixel unit) in the light-emitting diode layer 300 may be made of the same conductive material and have the same thickness, so that the bonding wire 510 and the pixel electrode can be simultaneously prepared by the same conductive material film layer. In one embodiment, the material of the bonding wire 510 and the pixel electrode may be copper, so as to increase the driving current of the light-emitting diode.

Optionally, as illustrated in FIG. 8, the first conductive via hole 710 and the second conductive via hole 720 may be provided on the flexible base layer 400, and the light-emitting diode layer 300 is electrically connected to the driving circuit layer 200 through the first conductive via hole 710. For example, for each pixel unit, the light-emitting diode located in the light-emitting diode layer 300 may be electrically connected to the pixel circuit located in the driving circuit layer 200 through the first conductive via hole 710. The bonding wire layer 500 is electrically connected to the driving circuit layer 200 through the second conductive via hole 720. For example, for each pixel unit, the bonding wire 510 in the bonding wire layer 500 may be electrically connected to the corresponding signal wire in the driving circuit layer 200 through the second conductive via hole 720.

In another embodiment, as illustrated in FIG. 16, the flexible base layer 400 may extend to the non-bonding region B and is located between the driving circuit layer 200 and the light-emitting diode layer 300. The array substrate further includes a conductive adhesive layer 630, and the conductive adhesive layer 630 is disposed between the driving circuit layer 200 and the flexible base layer 400.

Figure 18:
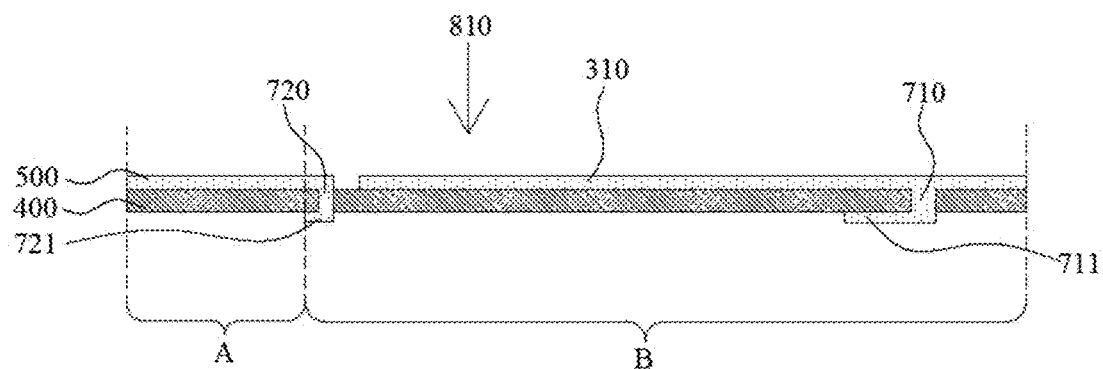
FIG. 18 is a schematic structural diagram of a first substrate according to an embodiment of the present disclosure.
Figure 21:
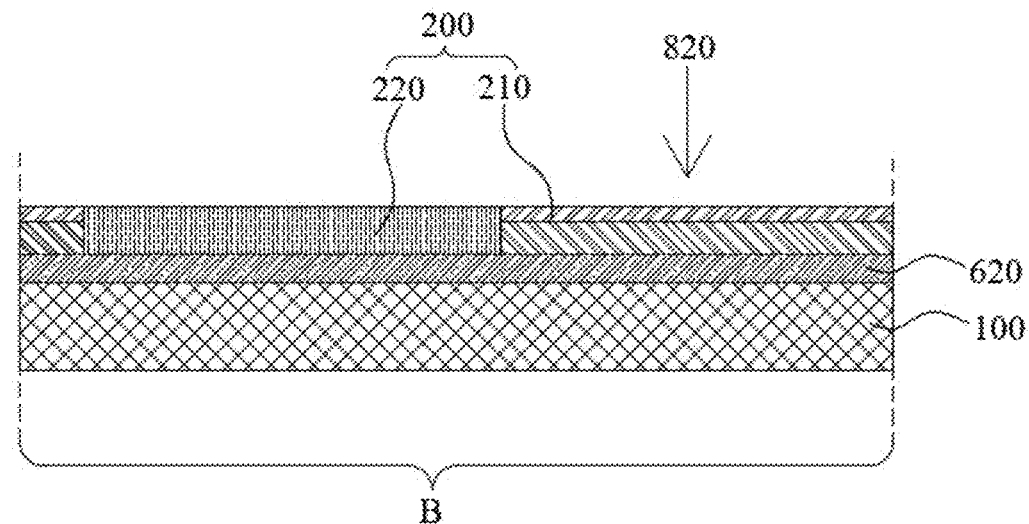
FIG. 21 is a schematic structural diagram of a second substrate according to an embodiment of the present disclosure.

In this way, as illustrated in FIG. 18, the bonding wire layer 500 and the light-emitting diode layer 300 are disposed on the same side of the flexible base layer 400, and the bonding wire layer 500, the light-emitting diode layer 300, and the flexible base layer 400 can be used as the first substrate 810 covering the bonding region A and the non-bonding region B. As illustrated in FIG. 21, the driving circuit layer 200 and the rigid substrate 100 can be used as the second substrate 820 located in the non-bonding region B. The first substrate 810 and the second substrate 820 can be bonded by the conductive adhesive layer 630 in a bonding manner, so as to form the array substrate according to the embodiment of the present disclosure.

Optionally, as illustrated in FIG. 16, the flexible base layer 400 is provided with the first conductive via hole 710 and the second conductive via hole 720, the light-emitting diode layer 300 is electrically connected to the driving circuit layer 200 through the first conductive via hole 710 and the conductive adhesive layer 630, and the bonding wire layer 500 is electrically connected to the driving circuit layer 200 through the second conductive via hole 720 and the conductive adhesive layer 630. It can be understood that, as illustrated in FIG. 16, the first conductive via hole 710 and the second conductive via hole 720 are located in the non-bonding region B.

Optionally, as illustrated in FIG. 18, in order to ensure effective electrical connection of the first conductive via hole 710 and the second conductive via hole 720 with the conductive adhesive layer 630, the side of the flexible base layer 400 close to the driving circuit layer 200 may further include a first connection electrode 711 and a second connection electrode 721. The first connection electrode 711 is electrically connected to the first conductive via hole 710, and the second connection electrode 721 is electrically connected to the second conductive via hole 720.

Optionally, the conductive adhesive layer 630 may be an anisotropic conductive film (ACF), so as to ensure that signals between the bonding wire layer 500 and the light-emitting diode layer 300 may not crosstalk each other and simplify the preparation of the conductive adhesive layer 630. For example, the conductive adhesive layer 630 may include an adhesive base material and a plurality of conductive particles dispersed in the adhesive base material. When the conductive adhesive layer is pressed, a conductive path may be formed at the pressed position. For example, the adhesive base material is thermoplastic resin or thermosetting resin, and the conductive particles may be metal particles or graphite particles.

Figure 23:
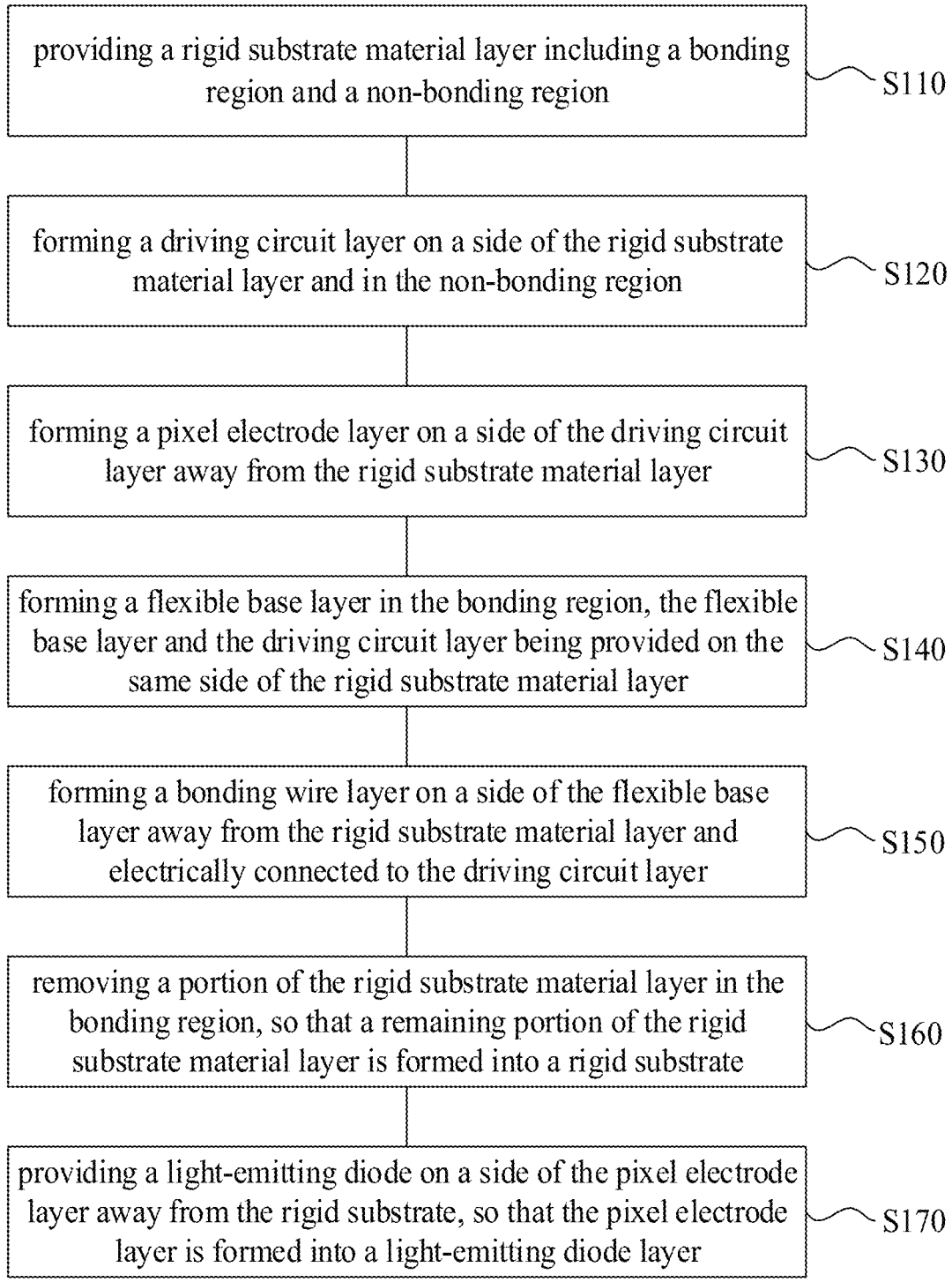
FIG. 23 is a schematic flowchart of a manufacturing method of an array substrate according to an embodiment of the present disclosure.

At least one embodiment of the present disclosure further provides a manufacturing method of an array substrate. As illustrated in FIG. 23, the manufacturing method of the array substrate may include the following steps S110 to S170.

Step S110: providing a rigid substrate material layer 101. The rigid substrate material layer 101 includes a bonding region A and a non-bonding region B.

Figure 4:
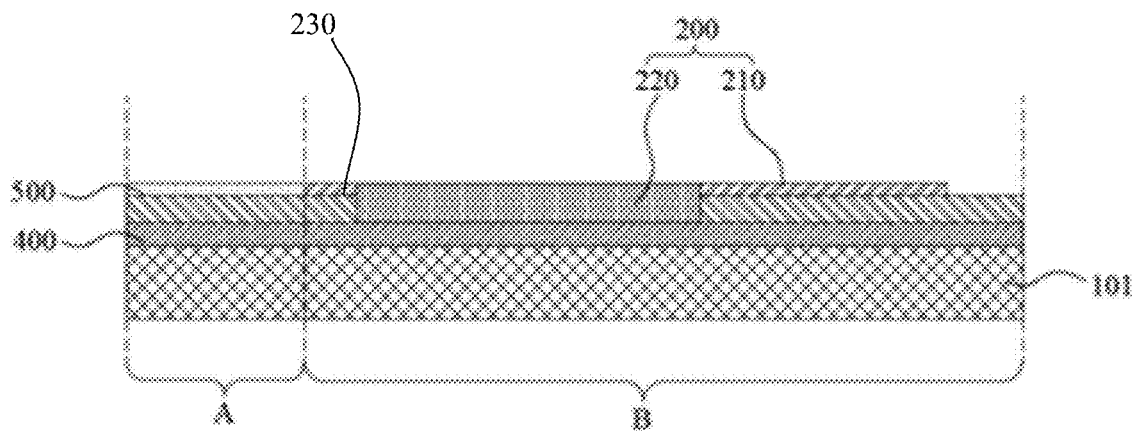
FIG. 4 is a schematic structural diagram of forming a driving circuit layer and a bonding wire layer according to an embodiment of the present disclosure.
Figure 11:
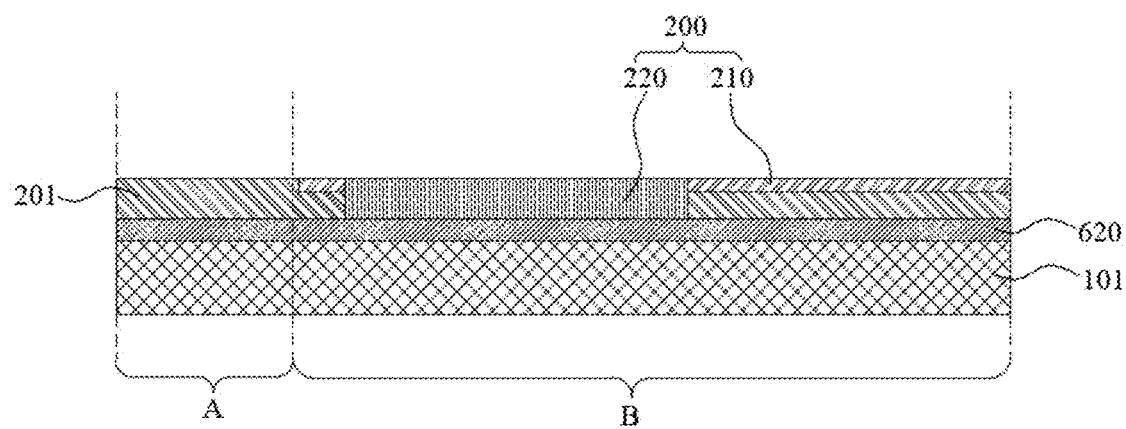
FIG. 11 is a schematic structural diagram of forming a driving circuit layer according to an embodiment of the present disclosure.

Step S120: as illustrated in FIG. 4 and FIG. 11, forming a driving circuit layer 200. The driving circuit layer 200 is provided on one side of the rigid substrate material layer 101 and located in the non-bonding region B.

Figure 6:
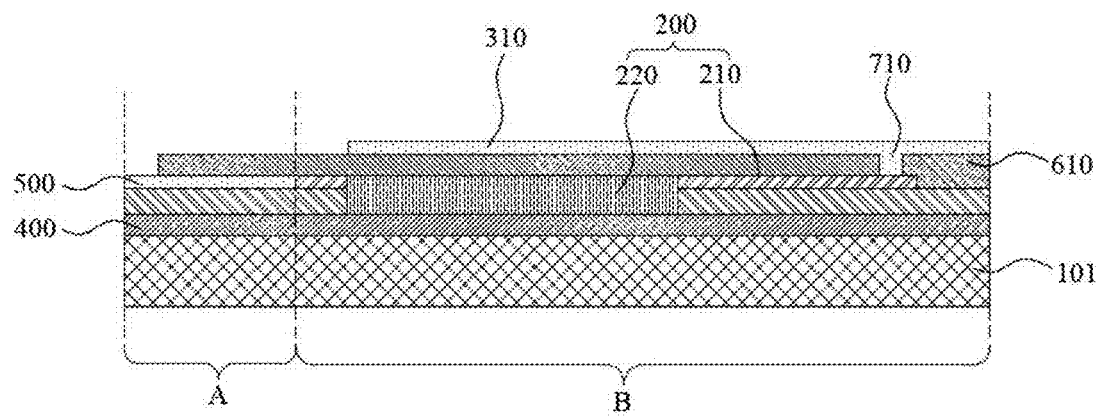
FIG. 6 is a schematic structural diagram of forming a pixel electrode layer according to an embodiment of the present disclosure.
Figure 13:
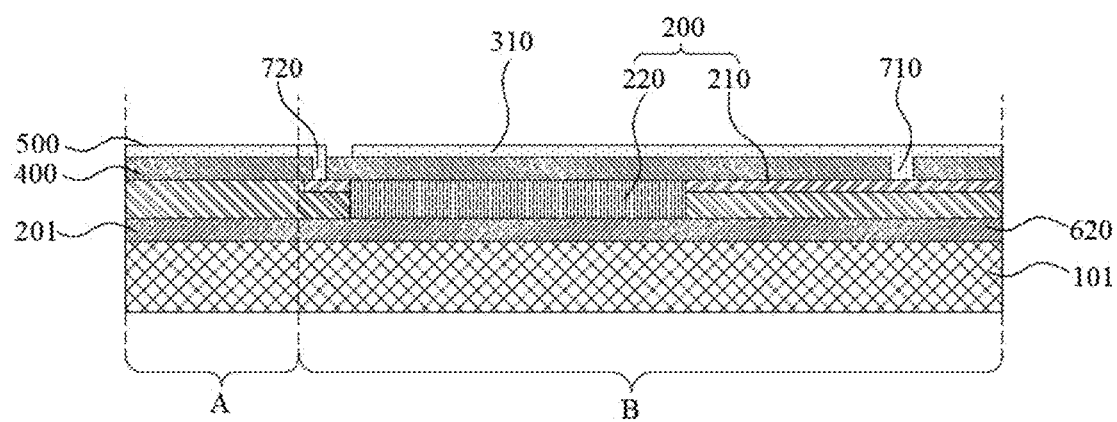
FIG. 13 is a schematic structural diagram of forming a pixel electrode layer and a bonding wire layer according to an embodiment of the present disclosure.

Step S130: as illustrated in FIG. 6 and FIG. 13, forming a pixel electrode layer 310. The pixel electrode layer 310 is disposed on a side of the driving circuit layer 200 away from the rigid substrate material layer 101.

Figure 3:
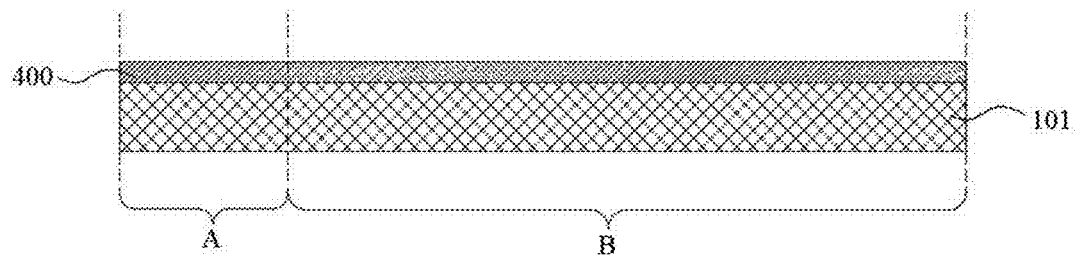
FIG. 3 is a schematic structural diagram of forming a flexible base layer according to an embodiment of the present disclosure.
Figure 12:
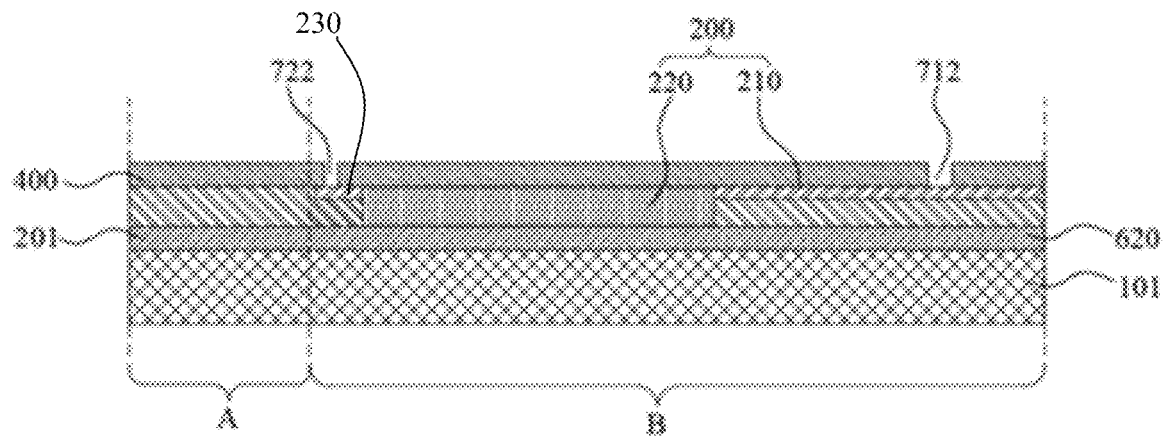
FIG. 12 is a schematic structural diagram of forming a flexible base layer according to an embodiment of the present disclosure.

Step S140: as illustrated in FIG. 3 and FIG. 12, forming a flexible base layer 400 in the bonding region A. The flexible base layer 400 and the driving circuit layer 200 are provided on the same side of the rigid substrate material layer 101.

Step S150: as illustrated in FIG. 4 and FIG. 13, forming a bonding wire layer 500. The bonding wire layer 500 is provided on a side of the flexible base layer 400 away from the rigid substrate material layer 101 and is electrically connected to the driving circuit layer 200.

Figure 7:
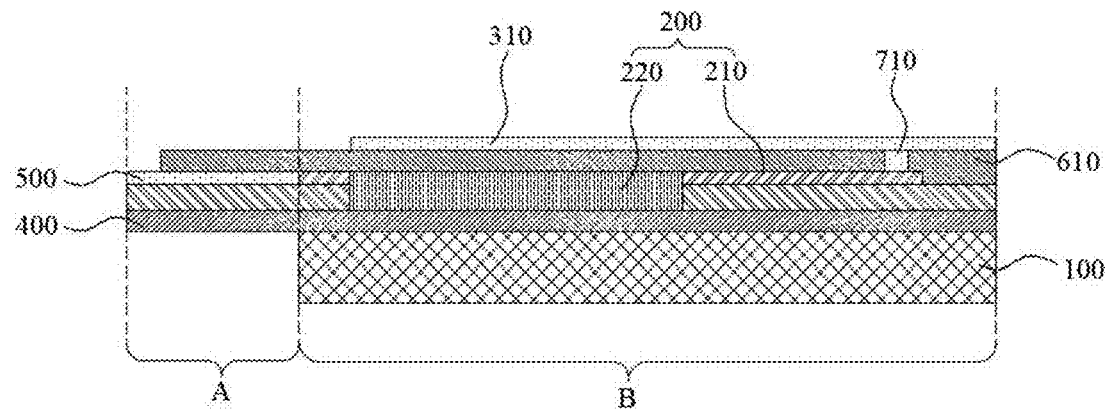
FIG. 7 is a schematic structural diagram of forming a rigid substrate according to an embodiment of the present disclosure.
Figure 14:
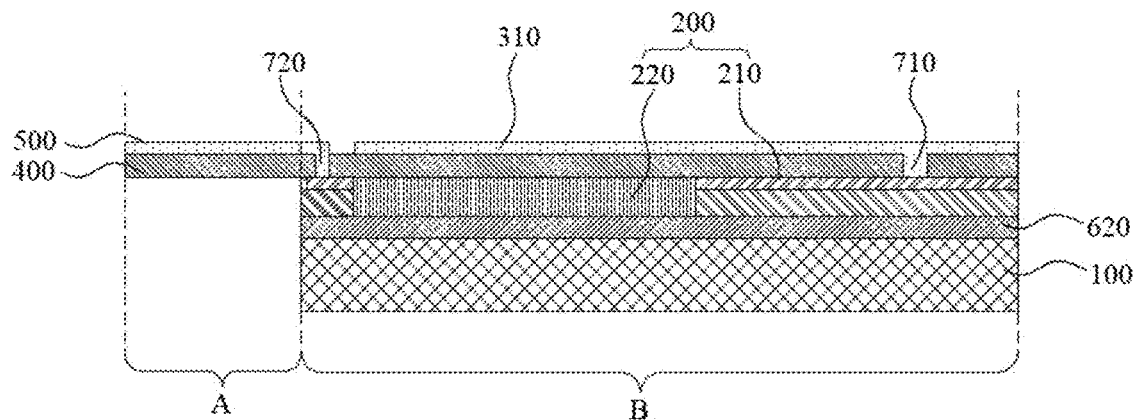
FIG. 14 is a schematic structural diagram of forming a rigid substrate according to an embodiment of the present disclosure.

Step S160: as illustrated in FIG. 7 and FIG. 14, removing a portion of the rigid substrate material layer 101 located in the bonding region A, so as to enable a remaining portion of the rigid substrate material layer 101 to form a rigid substrate 100, and enable the bonding wire layer 500 and the flexible base layer 400 to be bent along an edge of the rigid substrate 100 to a side of the rigid substrate 100 away from the driving circuit layer 200.

Step S170: as illustrated in FIG. 1 and FIG. 8, providing a light-emitting diode 320 on a surface of the pixel electrode layer 310 away from the rigid substrate 100, so as to enable the pixel electrode layer 310 to form a light-emitting diode layer 300.

The array substrate prepared by the manufacturing method of the array substrate according to the embodiment of the present disclosure, as illustrated in FIG. 1 and FIG. 8, the rigid substrate 100 is not provided in the bonding region A, so that the bonding wire layer 500 can be bent to the side of the rigid substrate 100 away from the driving circuit layer 200 (the back side of the array substrate), so as to be connected to the circuit board 900, which avoids the circuit board 900 from being connected to the side of the rigid substrate 100 close to the driving circuit layer 200 (the light-emitting side of the array substrate). Thus, the frame size of the display panel including the array substrate may be effectively reduced, and the gap of the display device spliced by display panels may be reduced, thereby improving the display effect.

Hereinafter, an example of each step of the manufacturing method of the array substrate provided by the embodiment of the present disclosure is described in detail with reference to the accompanying drawings.

In Step S110, the material of the rigid substrate material layer 101 may be glass, acrylic, or other materials.

In Step S120, as illustrated in FIG. 4 and FIG. 11, the driving circuit for driving the light-emitting diode 320 to emit light is provided in the driving circuit layer 200. For example, the driving circuit includes at least one electronic component 220. The electronic component 220 includes but is not limited to transistors, capacitors, resistors, coils, etc. It can be understood that the driving circuit layer 200 is further provided with a transfer electrode 210 and a signal wire 230 for connecting the electronic component 220. In one embodiment, thin film transistors are provided in the driving circuit. For example, the driving circuit layer 200 includes pixel circuits of a plurality of pixel units. In addition, the driving circuit layer 200 further includes various signal wires, and the various signal wires are respectively electrically connected to corresponding pixel circuits to provide scanning signals, data signals, power supply voltages, etc.

The driving circuit layer 200 is located in the non-bonding region B, which indicates that the orthographic projection of the driving circuit layer 200 on the rigid substrate material layer 101 is overlapped with the non-bonding region B.

In Step S130, as illustrated in FIG. 6 and FIG. 13, the pixel electrode layer 310 is electrically connected to the driving circuit layer 200. The pixel electrode layer 310 may be provided with a pixel electrode, and the pixel electrode is electrically connected to the corresponding pixel circuit in the driving circuit layer through the transfer electrode 210. As illustrated in FIG. 1 and FIG. 8, in the case where the light-emitting diode 320 is provided in Step S170, the light-emitting diode 320 may be connected to the pixel electrode in one-to-one correspondence, so that the pixel electrode layer 310 and the light-emitting diode 320 form the light-emitting diode layer 300 together.

In Step S140, the flexible base layer 400 may be made of a flexible material such as resin, for example, a polyimide material may be used. The flexible base layer 400 is used to support and fix the bonding wire layer 500 to prevent the bonding wire layer 500 from being damaged when being bent.

In Step S150, the bonding wire layer 500 may include a plurality of bonding wires 510 (bonding lines) and a plurality of bonding pads 520. The plurality of bonding wires 510 are connected to the plurality of signal wires 230 in the driving circuit layer 200 in one-to-one correspondence, and the plurality of bonding pads 520 are connected to ends of the plurality of bonding wires 510 away from the driving circuit in one-to-one correspondence. The signal wires 230 electrically connected to the plurality of bonding wires 510 include but are not limited to gate lines, data lines, power lines, etc., and the present disclosure is not limited in this aspect. In one aspect, in order to connect each bonding wire 510 to the corresponding bonding pad 520, the bonding wire layer 500 needs to have a certain width. If the bonding wire layer 500 cannot be bent to the back side of the rigid substrate 100 (the side of the rigid substrate 100 away from the driving circuit layer 200), the bonding wire layer 500 may completely appear on the light-emitting side of the display panel, which may cause the display panel to have a larger frame.

In the array substrate prepared by the manufacturing method according to the embodiment of the present disclosure, the bonding wire layer 500 can be bent towards the back side of the rigid substrate 100, which reduces the area of the bonding wire layer 500 exposed to the light-emitting side of the display panel, thereby reducing the frame size of the display panel.

In another aspect, the bonding pad 520 is used to be connected to the circuit board 900. If the bonding wire layer 500 cannot be bent towards the back side of the rigid substrate 100, the circuit board 900 needs to be connected to the light-emitting side of the display panel, which increases the frame size of the display panel. Even if the circuit board 900 is a flexible circuit board 900, the flexible circuit board 900 still increases the frame size of the display panel.

In the array substrate prepared by the manufacturing method according to the embodiment of the present disclosure, the bonding wire layer 500 can be bent towards the back side of the rigid substrate 100, so that the array substrate is bonded to the circuit board 900 on the back side, which avoids that the circuit board 900 needs to be arranged on the side surface of the rigid substrate 100 to increase the frame size of the display panel.

In Step S160, laser lift off technology (LLO) can be used to separate the part of the rigid substrate material layer 101 located in the bonding region A from other film structures including the flexible base layer; and the part of the rigid substrate material layer 101 located in the bonding region A may be removed by a cutting method.

In Step S170, the light-emitting diode 320 may be a micro light-emitting diode, a nano light-emitting diode, or other types of light-emitting diodes, and the present disclosure is not particularly limited in this aspect.

It can be understood that after the array substrate is prepared, as illustrated in FIG. 2 and FIG. 9, the circuit board 900 can also be connected to the bonding pad 520, and then the circuit board 900 can be bent and fixed to the back side of the rigid substrate 100 (the side of the rigid substrate 100 away from the driving circuit layer 200) through the bonding wire layer 500 and the flexible base layer 400, so as to obtain the display panel based on the array substrate. The circuit board 900 may be a flexible circuit board 900 or a rigid circuit board 900, and the present disclosure is not particularly limited in this aspect.

For example, the circuit board 900 is provided with a driver chip, and the driver chip includes but is not limited to a data driver, a gate driver, a timing controller, or the like, which is not limited in the present disclosure. The display panel has the characteristics of a narrow frame. For example, based on the display panel with a narrow frame, a display device with a smaller gap can be spliced.

In an embodiment, as illustrated in FIG. 3 and FIG. 4, Step S140 may be performed prior to Step S120. Optionally, as illustrated in FIG. 3, when Step S140 is performed, the flexible base layer 400 covering the bonding region A and the non-bonding region B may be formed on one side of the rigid substrate material layer 101. As illustrated in FIG. 4, in Step S120, the driving circuit layer 200 may be formed on the side of the flexible base layer 400 away from the rigid substrate material layer 101. In this way, in the prepared array substrate, the flexible base layer 400 may extend to the non-bonding region B and is located between the rigid substrate 100 and the driving circuit layer 200. In this way, the flexible base layer 400 can serve as a buffer layer between the driving circuit layer 200 and the rigid substrate 100.

As illustrated in FIG. 4 and FIG. 6, Step S150 may be performed prior to Step S130. Optionally, as illustrated in FIG. 4, while Step S120 is performed, Step S150 is performed, that is, the bonding wire layer 500 and the driving circuit layer 200 are formed at the same time. Optionally, when Step S120 and Step S150 are performed, signal wires can be simultaneously formed in the bonding region A and the non-bonding region B, the part of the signal wire located in the bonding region A is the bonding wire 510, and the part of the signal wire located in the non-bonding region B is the signal wire 230. For example, the bonding wire 510 and the corresponding signal wire 230 can be formed in the same process, which may simplify the manufacturing method of the array substrate.

Optionally, as illustrated in FIG. 4, when Step S120 and Step S150 are performed at the same time, the insulating material used to form the driving circuit layer 200 may remain in the bonding region A, and there may be insulating materials in the bonding wire layer 500 in the prepared array substrate.

Figure 5:
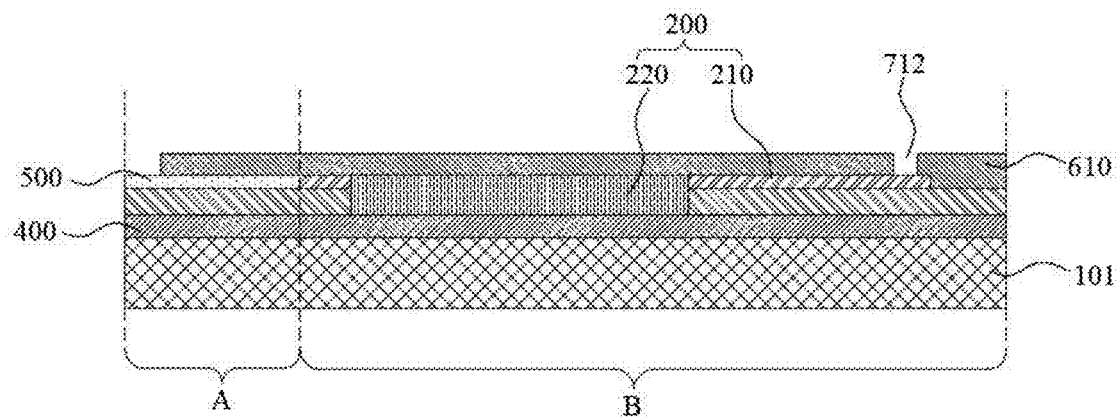
FIG. 5 is a schematic structural diagram of forming a planarization layer according to an embodiment of the present disclosure.

Optionally, as illustrated in FIG. 5, Step S180 may be performed prior to Step S130, and Step S180 includes: forming a planarization layer 610 on the side of the driving circuit layer 200 away from the rigid substrate material layer 101, so as to provide a flat surface for forming the pixel electrode layer 310. It can be understood that the first via hole 712 may be provided on the planarization layer 610, the first via hole 712 is used for metallization in Step S130 to become the first conductive via hole 710, and the first via hole 712 exposes the transfer electrode 210, so as to be electrically connected to the corresponding pixel circuit in the driving circuit layer 200 and the corresponding pixel electrode in the pixel electrode layer 310 through the transfer electrode 210.

Optionally, as illustrated in FIG. 5, in Step S180, the planarization layer 610 may also be disposed on the side of the bonding wire layer 500 away from the rigid substrate material layer 101 to protect the bonding wire layer 500. Further, the planarization layer 610 may expose the bonding pad 520 of the bonding wire layer 500, so as to facilitate connection of the bonding pad 520 and the circuit board 900.

In another embodiment, as illustrated in FIG. 11, in Step S120, when the driving circuit layer 200 is formed, the insulating material deposited in the bonding region A of the rigid substrate material layer 101 may be partially or completely retained as a supporting layer 201. In this way, in Step S120, the part of the rigid substrate material layer 101 located in the bonding region A can form the supporting layer 201.

As illustrated in FIG. 12 and FIG. 13, Step S140 may be performed between Step S120 and Step S130. Optionally, as illustrated in FIG. 12, when Step S140 is performed, the flexible base layer 400 covering the bonding region A and the non-bonding region B may be formed on the side of the supporting layer 201 and the driving circuit layer 200 away from the rigid substrate material layer 101. As illustrated in FIG. 13, in Step S130, the pixel electrode layer 310 may be formed on the side of the flexible base layer 400 away from the rigid substrate material layer 101. As illustrated in FIG. 13, in Step S150, the bonding wire layer 500 may be formed on the side of the flexible base layer 400 away from the rigid substrate material layer 101. In this way, in the prepared array substrate, the flexible base layer 400 may extend to the non-bonding region B and is located between the pixel electrode layer 310 and the driving circuit layer 200. In this way, the flexible base layer 400 can be used as a planarization layer between the driving circuit layer 200 and the pixel electrode layer 310.

It can be understood that, as illustrated in FIG. 12, the flexible base layer 400 may be provided with the first via hole 712 and the second via hole 722. The first via hole 712 is used for metallization in Step S130 to become the first conductive via hole 710, so as to electrically connect the driving circuit layer 200 and the pixel electrode layer 310. The second via hole 722 is used for metallization in Step S150 to become the second conductive via hole 720, and the second conductive via hole 720 exposes the corresponding signal wire 230, so that the signal wire 230 in the driving circuit layer 200 can be electrically connected to the corresponding bonding wire 510 in the bonding wire layer 500 through the second conductive via hole 720.

The embodiments do not specifically limit the execution sequence of Step S150 and Step S130. For example, Step S150 may be performed first, and then Step S130 may be performed. Optionally, while Step S130 is performed, Step S150 is simultaneously performed, that is, the bonding wire layer 500 and the pixel electrode layer 310 are formed at the same time.

Optionally, when Step S130 and Step S150 are performed, a conductive material film layer can be formed in the bonding region A and the non-bonding region B at the same time, and the conductive material film layer allows the first via hole 712 and the second via hole 722 to be respectively transformed into the first conductive via hole 710 and the second conductive via hole 720; then the conductive material film layer is patterned to obtain the bonding wire 510 located in the bonding region A and the pixel electrode located in the non-bonding region B. Optionally, the material of the conductive material film layer may be copper or copper alloy, so as to increase the driving current of the light-emitting diode.

Figure 10:
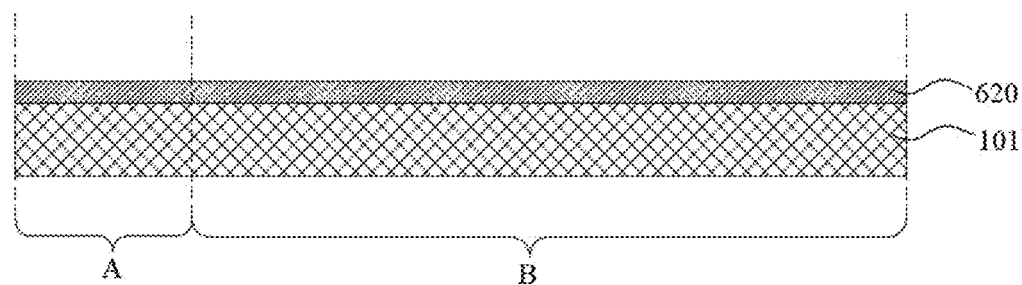
FIG. 10 is a schematic structural diagram of forming a buffer layer according to an embodiment of the present disclosure.

Optionally, as illustrated in FIG. 10, prior to Step S120, Step S190 may be performed and Step S190 includes: forming a buffer layer 620 on one side of the rigid substrate material layer 101. For example, the buffer layer 620 may be a flexible layer, such as another flexible substrate, and for example, may be made of a polyimide material or the like. The buffer layer 620 may cover the bonding region A and the non-bonding region B, so as to avoid adding a patterning process to the buffer layer 620 and simplify the manufacturing method of the array substrate according to the embodiment of the present disclosure. In Step S120, as illustrated in FIG. 11, the driving circuit layer 200 may be formed on the side of the buffer layer 620 away from the rigid substrate material layer 101. Certainly, in other embodiments, the buffer layer 620 may only cover the non-bonding region B.

Optionally, in Step S160, as illustrated in FIG. 14, the part of the buffer layer 620 located in the bonding region A and the supporting layer 201 may also be removed, so that the thickness of the array substrate in the bonding region A can be reduced, and the stress of the bonding region A when being bent can be reduced. Further, the part of the buffer layer 620 located in the bonding region A and the supporting layer 201 may be removed by a laser cladding method.

The embodiments of the present disclosure further provide another method for manufacturing the array substrate. As illustrated in FIG. 24, the method for manufacturing the array substrate may include the following steps.

Step S210: as illustrated in FIG. 18, proving a first substrate 810. The first substrate 810 includes a flexible base layer 400, a bonding wire layer 500, and a pixel electrode layer 310. The flexible base layer 400 includes a bonding region A and a non-bonding region B. The pixel electrode layer 310 and the bonding wire layer 500 are provided on the same side of the flexible base layer 400, the bonding wire layer 500 is located in the bonding region A, and the pixel electrode layer 310 is located in the non-bonding region B. The flexible base layer 400 is provided with a second conductive via hole 720 electrically connected to the bonding wire layer 500 in the non-bonding region B.

Step S220: as illustrated in FIG. 21, providing a second substrate 820. The second substrate 820 includes a rigid substrate 100 and a driving circuit layer 200 which are stacked. When the second substrate 820 and the first substrate 810 are bonded, the orthographic projection of the second substrate 820 on the first substrate 810 can coincide with the non-bonding region B.

Figure 22:
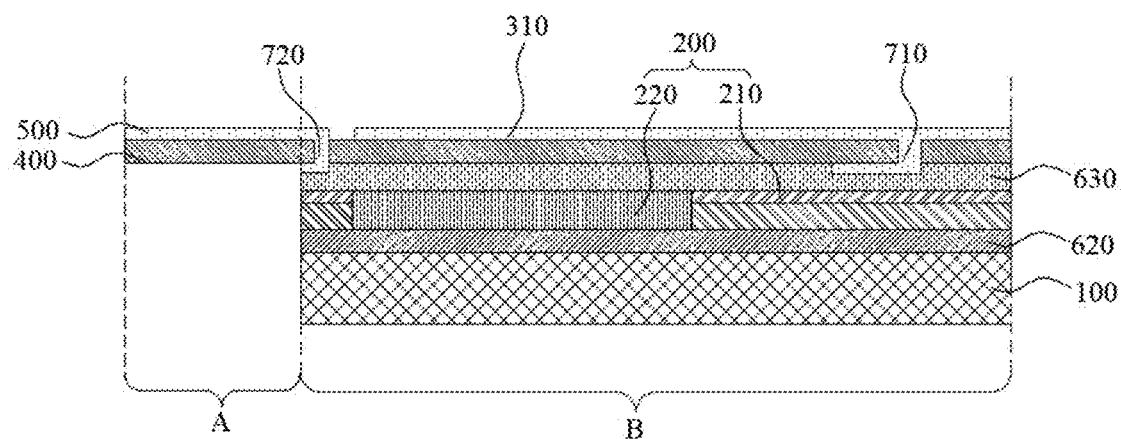
FIG. 22 is a schematic structural diagram of a first substrate and a second substrate which are bonded with each other according to an embodiment of the present disclosure.

Step S230: as illustrated in FIG. 22, allowing the first substrate 810 and the second substrate 820 to be bonded, so that the side of the driving circuit layer 200 away from the rigid substrate 100 is connected to the side of the flexible base layer 400 away from the pixel electrode layer 310 through the conductive adhesive layer 630 in the non-bonding region B.

Step S240: as illustrated in FIG. 16, providing a light-emitting diode 320 on the side of the pixel electrode layer 310 away from the rigid substrate 100, so that the pixel electrode layer 310 can form the light-emitting diode layer 300.

In the array substrate prepared by the manufacturing method of the array substrate according to the embodiments of the present disclosure, as illustrated in FIG. 16 and FIG. 17, the rigid substrate 100 is not provided in the bonding region A, so that the bonding wire layer 500 can be bent to the side of the rigid substrate 100 away from the driving circuit layer 200 (the back side of the array substrate), so as to be connected to the circuit board 900, which avoids the circuit board 900 from being connected to the side of the rigid substrate 100 close to the driving circuit layer 200 (the light-emitting side of the array substrate). Thus, the frame size of the display panel including the array substrate may be effectively reduced, and the gap of the display device spliced by display panels may be reduced, thereby improving the display effect.

Hereinafter, each step of the manufacturing method of the array substrate provided by the embodiments of the present disclosure is described in detail with reference to the accompanying drawings.

In one embodiment, in Step S210, the first substrate 810 may be provided by the following method.

Step 310: providing a base substrate 811.

Step 320: forming a flexible base layer 400 on one side of the base substrate 811. The flexible base layer 400 includes a bonding region A and a non-bonding region B.

Figure 19:
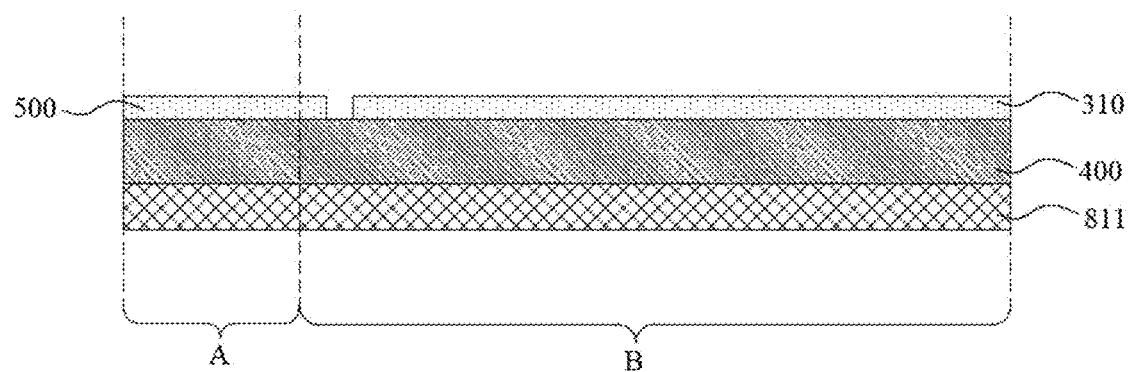
FIG. 19 is a schematic structural diagram of forming a pixel electrode layer and a bonding wire layer according to an embodiment of the present disclosure.

Step 330: as illustrated in FIG. 19, forming a bonding wire layer 500. The bonding wire layer 500 is disposed on the side of the flexible base layer 400 away from the base substrate 811 and located in the bonding region A.

Step 340: as illustrated in FIG. 19, forming a pixel electrode layer 310. The pixel electrode layer 310 is disposed on the side of the flexible base layer 400 away from the base substrate 811 and located in the non-bonding region B.

Figure 20:
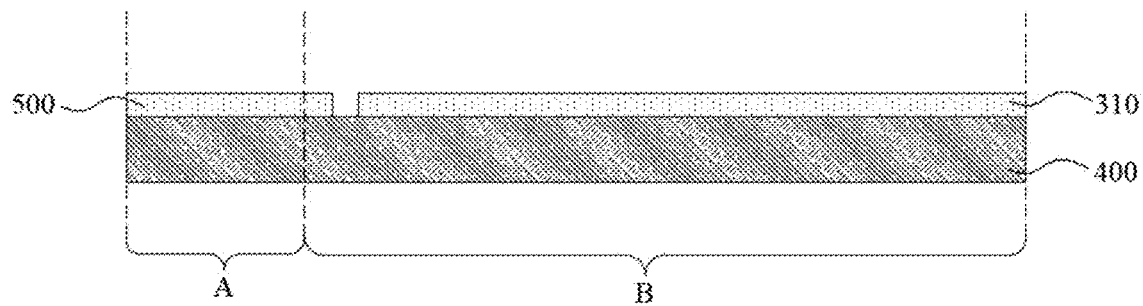
FIG. 20 is a schematic structural diagram of removing a base substrate according to an embodiment of the present disclosure.

Step 350: as illustrated in FIG. 20, removing the base substrate 811.

Step 360: as illustrated in FIG. 18, forming a second conductive via hole 720 on the flexible base layer 400 in the non-bonding region B. The second conductive via hole 720 is electrically connected to the bonding wire layer 500.

Optionally, in Step 360, as illustrated in FIG. 18, the second conductive via hole 720 may be formed on the flexible base layer 400 in the non-bonding region B, and the second conductive via hole 720 is electrically connected to the pixel electrode layer 310.

Optionally, in Step 360, as illustrated in FIG. 18, a first connection electrode 711 and a second connection electrode 721 may also be formed on the side of the flexible base layer 400 away from the pixel electrode layer 310. The first connection electrode 711 is connected to the first conductive via hole 710 to ensure that the first conductive via hole 710 can be fully electrically connected to the conductive adhesive layer 630. The second connection electrode 721 is connected to the second conductive via hole 720 to ensure that the second conductive via hole 720 can be fully electrically connected to the conductive adhesive layer 630.

Optionally, as illustrated in FIG. 19, Step 330 and Step 340 may be performed at the same time, that is, the bonding wire layer 500 and the pixel electrode layer 310 are formed at the same time.

It can be understood that in the array substrate prepared by the manufacturing method of the array substrate according to the embodiment of the present disclosure, the flexible base layer 400 extends into the non-bonding region B and is located between the driving circuit layer 200 and the light-emitting diode layer 300, so as to serve as the planarization layer 610 of the array substrate.

In Step S220, the provided second substrate 820 should meet the following requirements, that is, when the second substrate 820 is bonded with the first substrate 810, the orthographic projection of the second substrate 820 on the first substrate 810 can coincide with the non-bonding region B. In other words, when the second substrate 820 is bonded with the first substrate 810, the second substrate 820 can expose the bonding region A of the first substrate 810.

Optionally, as illustrated in FIG. 21, the second substrate 820 may further include a buffer layer 620, and the buffer layer 620 is disposed between the rigid substrate 100 and the driving circuit layer 200.

In Step S230, a conductive adhesive layer 630 may first be provided on the second substrate 820 or the non-bonding region B of the first substrate 810, and then the second substrate 820 may be aligned with and combined to the non-bonding region B of the first substrate 810. It can be understood that, as illustrated in FIG. 22, the second substrate 820 is aligned with the non-bonding region B of the first substrate 810, which means that the orthographic projection of the second substrate 820 on the first substrate 810 can coincide with the non-bonding region B of the first substrate 810. When the second substrate 820 is aligned with the non-bonding region B of the first substrate 810, the surface of the driving circuit layer 200 away from the rigid substrate 100 faces towards the surface of the non-bonding region B of the flexible base layer 400 away from the pixel electrode layer 310, and the conductive adhesive layer 630 is disposed on one of the two surfaces.

Optionally, the conductive adhesive layer 630 may be an anisotropic conductive adhesive film.

It should be noted that although the various steps of the method in the present disclosure are described in a specific sequence in the drawings, this does not require or imply that these steps must be performed in the specific sequence, or that all the illustrated steps must be performed to achieve the desired result. Additionally or alternatively, certain steps may be omitted, multiple steps may be combined into one step for execution, and/or one step may be divided into multiple steps for execution, etc., which should be regarded as part of the present disclosure.

The embodiments of the present disclosure further provide a display panel, and the display panel includes any one of the array substrates described in the above-mentioned array substrate embodiments.

Optionally, referring to FIG. 2, FIG. 9, and FIG. 17, the display panel further includes the circuit board 900, and the circuit board 900 is provided with a driver chip. The bonding region A of the array substrate is bent along the edge of the rigid substrate 100 to the side of the rigid substrate 100 away from the driving circuit layer 200, and the circuit board 900 is electrically connected to the bonding wire layer 500 and located on the side of the rigid substrate 100 away from the driving circuit layer 200.

The array substrate used in the display panel according to the embodiments of the present disclosure is the same as the array substrate in the above-mentioned embodiment of the array substrate, and therefore, has the same beneficial effects, and details are not described herein. As understood by those skilled in the art, in addition to the structure of the above-mentioned array substrate, the display panel or the array substrate provided by the embodiments of the present disclosure may also include other necessary packaging elements and functional circuits, for example, touch circuits, fingerprint recognition circuits, or the like, so as to further include touch and fingerprint recognition functions.

Figure 25:
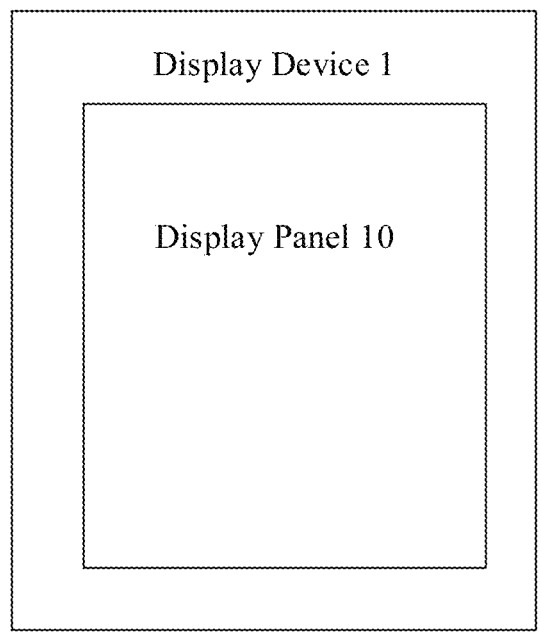
FIG. 25 is a schematic structural diagram of a display device according to an embodiment of the present disclosure.

The present disclosure further provides a display device, and the display device includes the display panel described in the above display panel embodiments. As illustrated in FIG. 25, the display device 1 includes any one of the display panels 10 described above.

For example, the display device may be an electronic advertising screen, a stage background screen, a television, or other types of display devices, and the present disclosure is not specifically limited in this aspect.

The display panel adopted by the display device according to the embodiments of the present disclosure is the same as the display panel in the above-mentioned embodiments of the display panel, and therefore, has the same beneficial effects, and details are not described herein.

It should be understood that the present disclosure does not limit the application to the detailed structure and arrangement of components proposed in the specification. The present disclosure can have other embodiments, and can be achieved and implemented in various manners. The aforementioned deformations and modifications fall within the protection scope of the present disclosure.

What have been described above merely are specific implementations of the present disclosure, but the protection scope of the present disclosure is not limited to this. The protection scope of the present disclosure is determined by the appended claims.

What is claimed is:

1. An array substrate, comprising a bonding region and a non-bonding region, wherein the array substrate further comprises:
    a rigid substrate, in the non-bonding region;
    a driving circuit layer, on a side of the rigid substrate and in the non-bonding region;
    a light-emitting diode layer, on a side of the driving circuit layer away from the rigid substrate and being electrically connected to the driving circuit layer;
    a flexible base layer, in the bonding region and on the same side of the rigid substrate as the driving circuit layer; and
    a bonding wire layer, on a side of the flexible base layer away from the rigid substrate and being electrically connected to the driving circuit layer,
    wherein the bonding wire layer and the flexible base layer is capable of being bent along an edge of the rigid substrate to a side of the rigid substrate away from the driving circuit layer;
    wherein the flexible base layer extends to the non-bonding region and is between the rigid substrate and the driving circuit layer, or the flexible base layer extends to the non-bonding region and is between the driving circuit layer and the light-emitting diode layer.

2. The array substrate according to claim 1, wherein the array substrate further comprises:
    a planarization layer, between the driving circuit layer and the light-emitting diode layer,
    wherein the planarization layer extends to a side of the bonding wire layer away from the rigid substrate.

3. The array substrate according to claim 1, wherein the flexible base layer is provided with a conductive via hole electrically connected to the bonding wire layer; and
the array substrate further comprises:
a conductive adhesive layer, between the driving circuit layer and the flexible base layer, wherein the bonding wire layer is electrically connected to the driving circuit layer through the conductive via hole and the conductive adhesive layer.

4. The array substrate according to claim 3, wherein the flexible base layer further comprises:
a connection electrode, on a side of the flexible base layer away from the light-emitting diode layer and being electrically connected to the bonding wire layer through the conductive via hole.

5. The array substrate according to claim 1, further comprising:
a buffer layer, between the rigid substrate and the driving circuit layer.

6. The array substrate according to claim 5, wherein the buffer layer is a flexible layer.

7. The array substrate according to claim 1, wherein the light-emitting diode layer comprises a pixel electrode layer and one or more light-emitting diodes on the pixel electrode layer.

8. The array substrate according to claim 7, wherein the light-emitting diodes comprise micro light-emitting diodes arranged in an array.

9. The array substrate according to claim 1, wherein the bonding wire layer comprises a plurality of bonding wires and a plurality of bonding pads,
the plurality of bonding wires are electrically connected to the driving circuit layer, and the plurality of bonding pads are electrically connected to ends of the plurality of bonding wires away from the driving circuit layer in one-to-one correspondence.

10. The array substrate according to claim 9, further comprising:
a bonding circuit component, wherein the bonding circuit component is in the bonding region and is electrically connected to the plurality of bonding pads.

11. A display panel, comprising the array substrate according to claim 1.

12. A display device, comprising the display panel according to claim 11.

13. A manufacturing method of an array substrate, comprising:
providing a rigid substrate material layer, wherein the rigid substrate material layer comprises a bonding region and a non-bonding region;
forming a driving circuit layer, wherein the driving circuit layer is provided on a side of the rigid substrate material layer and is in the non-bonding region;
forming a pixel electrode layer, wherein the pixel electrode layer is provided on a side of the driving circuit layer away from the rigid substrate material layer;
forming a flexible base layer in the bonding region, wherein the flexible base layer and the driving circuit layer are provided on the same side of the rigid substrate material layer;
forming a bonding wire layer, wherein the bonding wire layer is provided on a side of the flexible base layer away from the rigid substrate material layer and is electrically connected to the driving circuit layer;
removing a portion of the rigid substrate material layer in the bonding region, so that a remaining portion of the rigid substrate material layer is formed into a rigid substrate, and the bonding wire layer and the flexible base layer is capable of being bent along an edge of the rigid substrate to a side of the rigid substrate away from the driving circuit layer; and
providing a light-emitting diode on a side of the pixel electrode layer away from the rigid substrate, so that the pixel electrode layer and the light-emitting diode are form into a light-emitting diode layer;
wherein the flexible base layer extends to the non-bonding region and is between the rigid substrate and the driving circuit layer, or the flexible base layer extends to the non-bonding region and is between the driving circuit layer and the light-emitting diode layer.

14. The manufacturing method according to claim 13, wherein the flexible base layer is in the non-bonding region and the bonding region, and is between the rigid substrate material layer and the driving circuit layer, and
removing the portion of the rigid substrate material layer in the bonding region comprises:
separating the portion of the rigid substrate material layer in the bonding region from the flexible base layer by a lifting method, and removing the portion of the rigid substrate material layer in the bonding region by a cutting method.

15. The manufacturing method according to claim 13, wherein the flexible base layer is in the non-bonding region and the bonding region, the flexible base layer extends to the non-bonding region and is between the driving circuit layer and the light-emitting diode layer, and the manufacturing method further comprises:
forming a buffer layer on the rigid substrate material layer, wherein the driving circuit layer is formed on a side of the buffer layer away from the rigid substrate material layer, and
removing a portion of the buffer layer in the bonding region subsequent to removing the portion of the rigid substrate material layer in the bonding region.

16. The manufacturing method according to claim 15, wherein forming the flexible base layer in the bonding region comprises:
forming a conductive via hole electrically connected to the bonding wire layer in the flexible base layer.

17. The manufacturing method according to claim 16, wherein forming the flexible base layer in the bonding region further comprises:
forming a connection electrode on a side of the flexible base layer away from the pixel electrode layer, wherein the connection electrode is electrically connected to the bonding wire layer through the conductive via hole.

18. A manufacturing method of an array substrate, comprising:
providing a first substrate, wherein the first substrate comprise a flexible base layer, a bonding wire layer and a pixel electrode layer, the flexible base layer comprises a bonding region and a non-bonding region, the pixel electrode layer and the bonding wire layer are provided on the same side of the flexible base layer, the bonding wire layer is in the bonding region, the pixel electrode layer is in the non-bonding region, and the non-bonding region of the flexible base layer is provided with a conductive via hole electrically connected to the bonding wire layer;
providing a second substrate, wherein the second substrate comprises a rigid substrate and a driving circuit layer arranged in a stack, so as to enable an orthographic projection of the second substrate on the first substrate to coincide with the non-bonding region in a case where the second substrate and the first substrate are bonded with each other;

bonding the first substrate and the second substrate to each other, so as to enable a surface of the driving circuit layer away from the rigid substrate to be connected to a surface of the non-bonding region of the flexible base layer away from the pixel electrode layer; and providing a light-emitting diode on a surface of the pixel electrode layer away from the rigid substrate, so as to enable the pixel electrode layer and the light-emitting diode to form a light-emitting diode layer.

\* \* \* \* \*